United States Patent
Lynch et al.

(10) Patent No.: US 9,126,280 B2
(45) Date of Patent: *Sep. 8, 2015

(54) PRINT HEAD FOR STENCIL PRINTER

(71) Applicant: Illinois Tool Works Inc., Glenview, IL (US)

(72) Inventors: James Lynch, Woburn, MA (US); Dennis G. Doyle, Shrewsbury, MA (US); Kenneth King, East Freetown, MA (US); Joseph A. Perault, Natick, MA (US); John George Klauser, Holliston, MA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/503,879

(22) Filed: Oct. 1, 2014

(65) Prior Publication Data

US 2015/0014396 A1 Jan. 15, 2015

Related U.S. Application Data

(63) Continuation of application No. 13/368,942, filed on Feb. 8, 2012, now Pat. No. 8,939,073.

(51) Int. Cl.
*B41F 15/42* (2006.01)
*B41M 1/12* (2006.01)
*B23K 3/06* (2006.01)
*B41F 15/08* (2006.01)
(Continued)

(52) U.S. Cl.
CPC .......... *B23K 3/0638* (2013.01); *B41F 15/0881* (2013.01); *B41F 15/42* (2013.01); *H05K 3/1233* (2013.01); *H05K 13/0465* (2013.01); *B41P 2215/50* (2013.01); *H05K 3/3484* (2013.01)

(58) Field of Classification Search
None
See application file for complete search history.

(56) References Cited

U.S. PATENT DOCUMENTS 5,947,022 A 9/1999 Freeman et al.
6,250,513 B1 * 6/2001 Haas .............................. 222/414
(Continued)

FOREIGN PATENT DOCUMENTS

CN 1339993 A 3/2002
CN 1761565 A 4/2006
(Continued)

OTHER PUBLICATIONS

Notification of Transmittal of the International Search Report and the Written Opinon of the International Searching Authority from corresponding PCT/US2013/025017 mailed Jun. 28, 2013.

*Primary Examiner* — Daniel J Colilla
*Assistant Examiner* — Ruben Parco, Jr.
(74) *Attorney, Agent, or Firm* — Lando & Anastasi, LLP

(57) ABSTRACT

A stencil printer for printing viscous material on an electronic substrate includes a stencil having apertures formed therein, and a print head positioned over the stencil and configured to deposit viscous material within the apertures of the stencil. The print head includes a housing defining an elongate chamber, a source port defining a passage having an inlet positioned to allow viscous material to flow into the elongate chamber, a pair of blades defining a slot that provides an outlet from which viscous material can flow out of the elongate chamber, an elongate plunger movable in the elongate chamber to reduce a volume of viscous material within the elongate chamber, and at least one sensor to detect pressure of the viscous material within the elongate chamber.

19 Claims, 8 Drawing Sheets

(51) Int. Cl.
*H05K 3/12* (2006.01)
*H05K 13/04* (2006.01)
*H05K 3/34* (2006.01)

(56) References Cited

U.S. PATENT DOCUMENTS

| | | | |
|---|---|---|---|
| 6,324,973 | B2 | 12/2001 | Rossmeisl et al. |
| 6,453,810 | B1 | 9/2002 | Rossmeisl et al. |
| 6,588,335 | B1 | 7/2003 | Bourrieres et al. |
| 6,955,120 | B2 | 10/2005 | Pham-Van-Diep et al. |
| 7,249,558 | B2 | 7/2007 | Claiborne |
| 8,939,073 | B2 * | 1/2015 | Lynch et al. .......... 101/123 |
| 2001/0011506 | A1 | 8/2001 | Rossmeisl et al. |
| 2003/0019885 | A1 | 1/2003 | Luehrsen et al. |
| 2003/0081965 | A1 | 5/2003 | Ueda et al. |
| 2003/0097941 | A1 | 5/2003 | Rossmeisl et al. |
| 2004/0187716 | A1 | 9/2004 | Pham-Van-Diep et al. |
| 2004/0244612 | A1 | 12/2004 | Willshere |
| 2006/0124003 | A1 | 6/2006 | Sakaida et al. |
| 2010/0233646 | A1 * | 9/2010 | Brokx .......................... 433/36 |
| 2013/0199386 | A1 | 8/2013 | Lynch et al. |

FOREIGN PATENT DOCUMENTS

| | | |
|---|---|---|
| EP | 1 197 267 A1 | 4/2002 |
| JP | 2003072025 A | 3/2003 |
| WO | 0043156 A1 | 7/2000 |

* cited by examiner

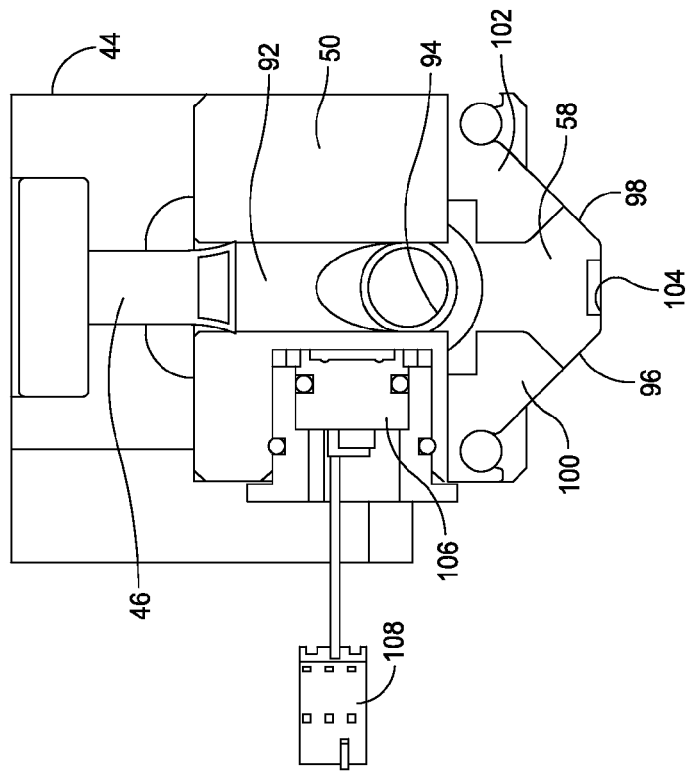
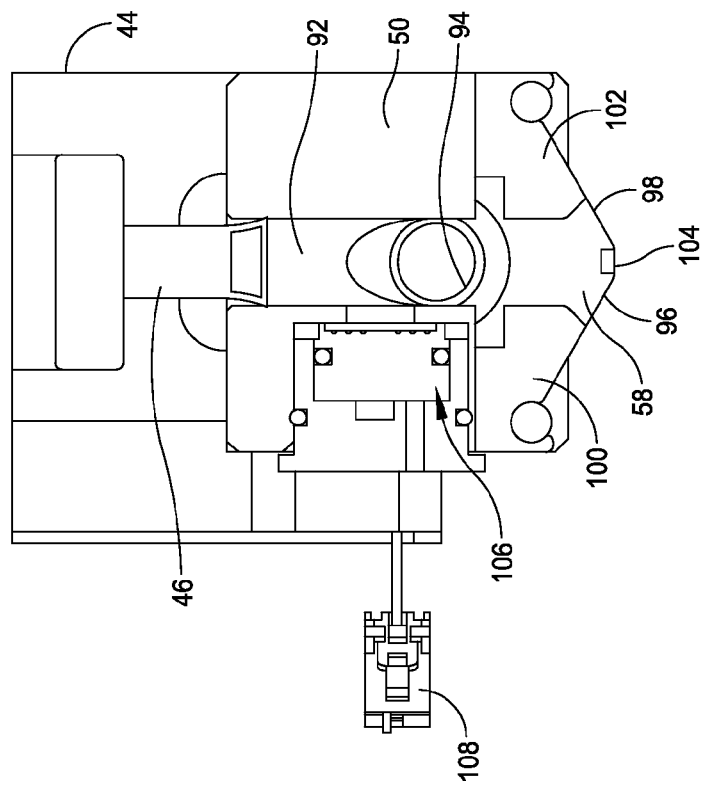

PRINT HEAD FOR STENCIL PRINTER

CROSS-REFERENCE TO RELATED APPLICATION

This application is a continuation of U.S. patent application Ser. No. 13/368,942 entitled "PRINT HEAD FOR STENCIL PRINTER," filed on Feb. 8, 2012, which is herein incorporated by reference in its entirety.

BACKGROUND

In manufacturing a surface-mount printed circuit board, a stencil printer can be used to print solder paste onto the circuit board. Typically, a circuit board having a pattern of pads or some other conductive surface onto which solder paste will be deposited is automatically fed into the stencil printer; and one or more small holes or marks (known as "fiducials") on the circuit board are used to properly align the circuit board with the stencil or screen of the stencil printer prior to printing solder paste onto the circuit board. In some systems, an optical alignment system is used to align the circuit board with the stencil.

Once the circuit board has been properly aligned with the stencil in the printer, the circuit board is raised to the stencil, solder paste is dispensed onto the stencil, and a wiper blade (or squeegee) traverses the stencil to force the solder paste through apertures in the stencil and onto the board. As the squeegee is moved across the stencil, the solder paste tends to roll in front of the blade, which desirably causes mixing and shearing of the solder paste so as to attain a desired viscosity to facilitate filling of the apertures in the screen or stencil. The solder paste typically is dispensed onto the stencil from a standard cartridge.

In some stencil printers, any excess solder paste remaining under the squeegee, after it has fully traversed the stencil, remains on the stencil when the squeegee is returned to its initial position for printing on a second circuit board. In some stencil printers, a second squeegee moves across the stencil in the direction opposite to that of the first squeegee. The first squeegee and the second squeegee are used on alternating boards to continually pass the roll of solder paste over the apertures of a stencil to print on each successive circuit board. In the stencil printers that utilize two squeegees, there is still the problem that at the end of a manufacturing day, or when the stencil is to be changed, which is excess solder paste typically remains on the stencil and must be manually removed. Also, in these known printers, it is difficult to maintain a desirable viscosity because volatile solvents escape from the solder paste, thereby affecting the viscosity of the solder paste.

In these stencil printers, the squeegee blades are typically at a predetermined angle with respect to the stencil to apply downward pressure on the solder paste to force the solder paste through the apertures in the stencil as the squeegee is moved across the stencil. The angle of the blade is selected based on the speed at which the blade traverses the stencil and based on the desired downward pressure on the solder paste from the blade. It is desirable to maintain a consistent pressure on the solder paste as the squeegee traverses the stencil; however, in a typical printer, the pressure varies due to variations in paste viscosity throughout a production run and due to variations in the angle of the squeegee caused by deformation of the squeegee due to the pressure applied by the squeegee driving device.

Responding to some of the problems, noted above, improved solder paste print heads are described in U.S. Pat. Nos. 5,947,022, 6,324,973, 6,453,810, and 6,955,120, each of which is incorporated herein by reference in their entirety. These patents describe a movable print head having a chamber including ports to which removable cartridges that supply solder paste are coupled. Solder paste is passed from the removable cartridges, into the chamber, then out of a dispensing slot, through a stencil and onto a circuit board in a desired pattern.

There is presently a need for a print head having improved pressure control, especially across the entire width of the print head, greater flexibility, reduced maintenance, and increased value to the operator.

SUMMARY

The improved print head disclosed herein includes a chamber with a direct pressure control system for discharging viscous material from the chamber. A "viscous" material is a material that has a viscosity sufficient under the given configuration and conditions such that the material will not naturally (under simple gravitational principles) flow without other external forces to fill and dispense from a dispensing region within the chamber. A viscous material print head (also known as a "dispensing head") of this disclosure has a chamber through which viscous material (e.g., solder paste) can be channeled. The print head includes at least one source port that can be coupled with a source of viscous material, such as a solder paste cartridge, and a dispensing slot through which the viscous material can exit the chamber.

The print head can be mounted to a frame, to which a stencil is also mounted. The stencil is positioned between the dispensing slot of the print head and the substrate (e.g., a printed circuit board). Viscous material can accordingly be dispensed from the print head through apertures in the stencil and onto selected locations on the surface of the substrate.

Aspects of the present disclosure are directed to a stencil printer for printing viscous material on an electronic substrate. In one embodiment, the stencil printer comprises a stencil having apertures formed therein, and a print head positioned over the stencil and configured to deposit viscous material within the apertures of the stencil. The print head includes a housing defining an elongate chamber, a source port defining a passage having an inlet positioned to allow viscous material to flow into the elongate chamber, a pair of blades defining a slot that provides an outlet from which viscous material can flow out of the elongate chamber, an elongate plunger movable in the elongate chamber to reduce a volume of viscous material within the elongate chamber, and at least one sensor to detect pressure of the viscous material within the elongate chamber.

Embodiments of the stencil printer further include a controller coupled with the print head to control the operation of an elongate plunger to maintain the viscous material at a desired pressure. The print head further may include a motor, which is coupled to the housing of the print head and to the controller, to drive the movement of the elongate plunger within the elongate chamber under the control of the controller. The at least one sensor may include a pressure transducer provided along a wall of the elongate chamber. The stencil printer further may comprise a flexible membrane positioned between the elongate plunger and the viscous material disposed within the elongate chamber. The blades may be angled toward one another. The stencil printer further may comprise three sensors positioned along a length of the elongate chamber.

Another aspect of the disclosure is directed to a method for printing solder paste comprising: supplying viscous material to an elongate chamber of a print head; applying pressure to the viscous material with an elongate plunger to displace the viscous material onto a substrate; and sensing pressure within the elongate chamber to maintain the viscous material at a desired pressure.

Embodiments of the method further include sensing pressure within the elongate chamber by averaging readings taken from multiple pressure transducers positioned within the elongate chamber to control pressure of viscous material within the elongate chamber. The method further may comprise disposing a flexible membrane between the elongate plunger and viscous material disposed within the elongate chamber. The method further may comprise supplying viscous material to the elongate chamber while maintaining the viscous material at the desired pressure. Sensing pressure may occur at a left-hand side of the elongate chamber and at a right-hand side of the elongate chamber. The method further may comprise positively controlling the amount of viscous material discharged from the elongate chamber during a print stroke. The viscous material may be solder paste, and the method further may comprise passing the solder paste through a stencil as the solder paste is discharged from the elongate chamber for selective deposition on the substrate.

Another aspect of the disclosure is directed to a print head comprising a housing defining an elongate chamber, a source port defining a passage having an inlet positioned to allow a viscous material to flow into the elongate chamber, a pair of blades defining a slot that provides an outlet from which the viscous material can flow out of the elongate chamber, an elongate plunger movable in the elongate chamber to reduce a volume of viscous material within the elongate chamber, and means for detecting pressure of the viscous material within the elongate chamber.

Embodiments of the print head further may comprise a controller coupled with the print head to control the operation of an elongate plunger to maintain the viscous material at a desired pressure. The print head further may comprise a motor, which is coupled to the housing of the print head and to the controller, to drive the movement of the elongate plunger within the elongate chamber under the control of the controller. The means for detecting pressure may include a pressure transducer provided along a wall of the elongate chamber. The print head further may comprise a flexible membrane positioned under the elongate plunger within the elongate chamber. The blades may be are angled toward one another. The means for detecting pressure may include three sensors positioned along a length of the elongate chamber.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 6A is a cross-sectional view of the print head having blades at a 30° degree angle;

FIG. 6B is a cross-sectional view of the print head having blades at a 45° degree angle;

DETAILED DESCRIPTION

For purposes of illustration, embodiments of the present disclosure are described below, with reference to a stencil printer used to print solder paste onto a circuit board. The apparatus and associated methods may also be used in other applications requiring dispensing of other viscous or printing materials, such as glues, adhesives, and encapsulants on a variety of substrates. For example, the apparatus may be used to print epoxy for use as underfill for chip-scale packages. Print heads of embodiments of this disclosure can be used in stencil printers. In certain embodiments, the stencil printer may include an Accela® or Momentum® series stencil printer platform offered by Speedline Technologies, Inc. of Franklin, Mass.

The print head of embodiments of the present disclosure are designed to provide controlled application of printing material for automated stencil printing operations. As mentioned above, the printing material may be solder paste, adhesives, or other printing materials. The material is protected from the ambient environment and is applied to the stencil under a regulated, controlled pressure. The printing material is enclosed in an elongate housing whose only opening is on the bottom, where it is held close against the stencil. The print head includes a mechanical elongate plunger on a top of the housing, which provides the means for applying controlled pressure to the material onto the stencil. Several pressure sensors are provided along a length of the housing to measure internal material pressure within the chamber. During operation, there are two forces to consider, the first being a force of the physical housing pushing against the stencil, and the second being the pressure applied to the material inside the chamber of the housing against the stencil. The first force is controlled by a print head z-axis control and the second force is controlled by the housing plunger.

Figure 1:
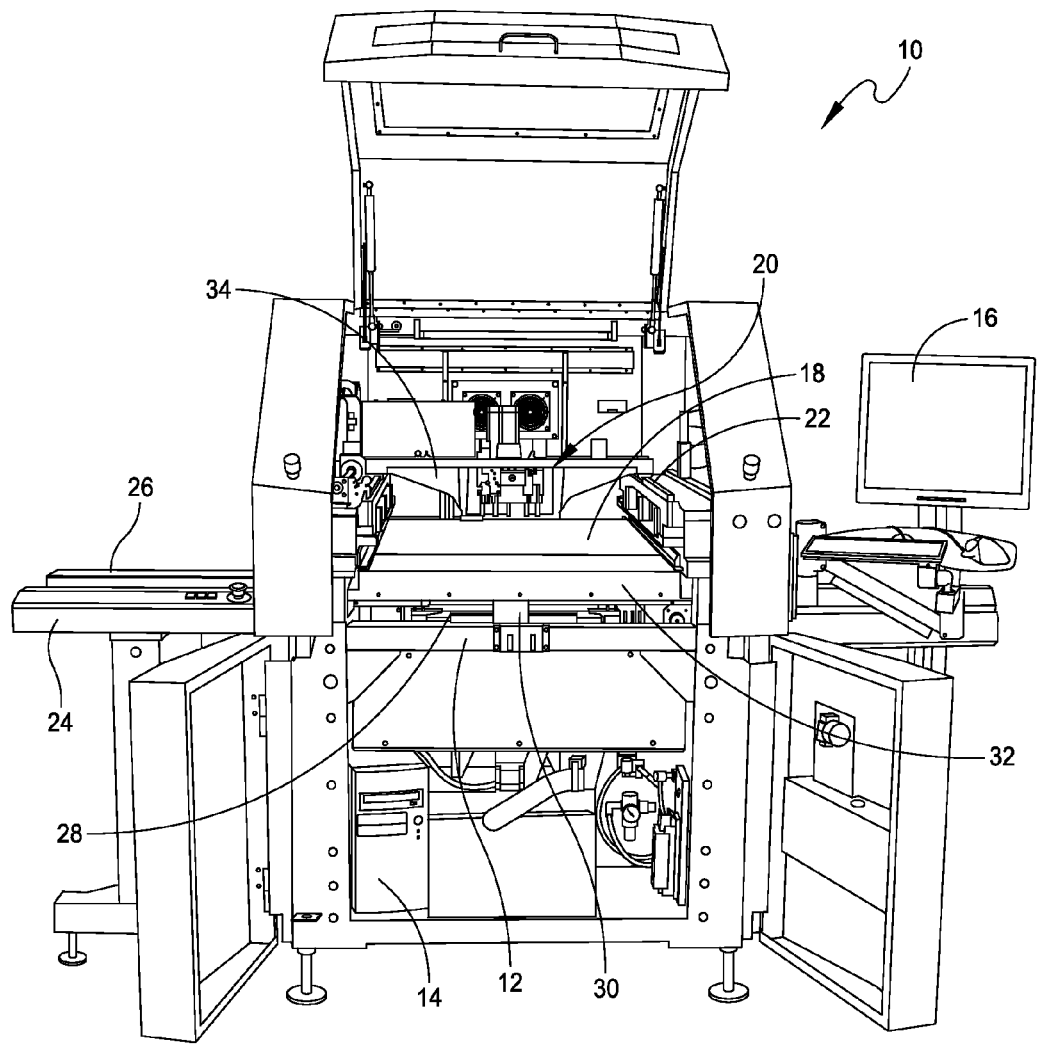
FIG. 1 is a front perspective view of a stencil printer of an embodiment of the present disclosure.

Referring now to the drawings, and more particularly to FIG. 1, there is generally indicated at 10 a stencil printer of an embodiment of the disclosure. As shown, the stencil printer 10 includes a frame 12 that supports components of the stencil printer. The components of the stencil printer may include, in part, a controller 14, a display 16, a stencil 18, and a print head assembly or print head, generally indicated at 20, which is configured to apply the solder paste in a manner described in greater detail below.

As shown in FIG. 1 and described below, the stencil and the print head may be suitably coupled or otherwise connected to the frame 12. In one embodiment, the print head 20 may be mounted on a print head gantry 22, which may be mounted on the frame 12. The print head gantry 22 enables the print head 20 to be moved in the y-axis direction under the control of the controller 14 and to apply pressure on the print head as it engages the stencil 18. As described below in further detail, the print head 20 may be placed over the stencil 18 and may be lowered in the z-axis direction into contact and sealingly engage the stencil.

The stencil printer 10 may also include a conveyor system having rails 24, 26 for transporting a printed circuit board (sometimes referred to as a "printed wiring board," "substrate," or "electronic substrate" herein) to a print position in the stencil printer. The rails 24, 26 sometimes may be referred to herein as a "tractor feed mechanism," which is configured to feed, load or otherwise deliver circuit boards to the working area of the stencil printer, which may be referred to herein as a "print nest," and to unload circuit boards from the print nest.

The stencil printer 10 has a support assembly 28 to support the circuit board, which raises and secures the circuit board so that it is stable during a print operation. In certain embodiments, the substrate support assembly 28 may further include a particular substrate support system, e.g., a solid support, a plurality of pins or flexible tooling, which is positioned beneath the circuit board when the circuit board is in the print position. The substrate support system may be used, in part, to support the interior regions of the circuit board to prevent flexing or warping of the circuit board during the print operation.

In one embodiment, as will be described in greater detail below, the print head 20 may be configured to receive solder paste from a source, such as a dispenser, e.g., a solder paste cartridge, that provides solder paste to the print head during the print operation. Other methods of supplying solder paste may be employed in place of the cartridge. For example, solder paste may be manually deposited between the blades or from an external source. Additionally, in a certain embodiment, the controller 14 may be configured to use a personal computer having a suitable operating system, such as a Microsoft DOS or Windows XP operating system, with application specific software to control the operation of the stencil printer 10. The controller 14 may be networked with a master controller that is used to control a production line for fabricating circuit boards.

In one configuration, the stencil printer 10 operates as follows. A circuit board is loaded into the stencil printer 10 using the conveyor rails 24, 26. The support assembly 28 raises and secures the circuit board to a print position. The print head 20 is then lowered in the z-axis direction until the blades of the print head contact the stencil 18 at a desired pressure. The print head 20 is then moved in the y-axis direction across the stencil 18 by the print head gantry 22. The print head 20 deposits solder paste through apertures in the stencil 18 and onto the circuit board. Once the print head has fully traversed the stencil 18 across the apertures, the print head is lifted off the stencil and the circuit board is lowered back onto the conveyor rails 24, 26. The circuit board is released and transported from the stencil printer 10 so that a second circuit board may be loaded into the stencil printer. To print on the second circuit board, the print head is lowered in the z-axis direction into contact with the stencil and moved across the stencil 18 in the direction opposite to that used for the first circuit board.

Still referring to FIG. 1, an imaging system 30 may be provided for the purposes of aligning the stencil 18 with the circuit board prior to printing and to inspect the circuit board after printing. In one embodiment, the imaging system 30 may be disposed between the stencil 18 and the support assembly 28 upon which a circuit board is supported. The imaging system 30 is coupled to an imaging gantry 32 to move the imaging system. In one embodiment, the imaging gantry 32 may be coupled to the frame 12, and includes a beam that extends between side rails of the frame 12 to provide back and forth movement of the imaging system 30 over the circuit board in a y-axis direction. The imaging gantry 32 further may include a carriage device, which houses the imaging system 30, and is configured to move along the length of the beam in an x-axis direction. The construction of the imaging gantry 32 used to move the imaging system 30 is well known in the art of solder paste printing. The arrangement is such that the imaging system 30 may be located at any position below the stencil 18 and above the circuit board to capture an image of predefined areas of the circuit board or the stencil, respectively. In other embodiments, when positioning the imaging system outside the print position the imaging system may be located above or below the stencil and the circuit board.

Figure 2:
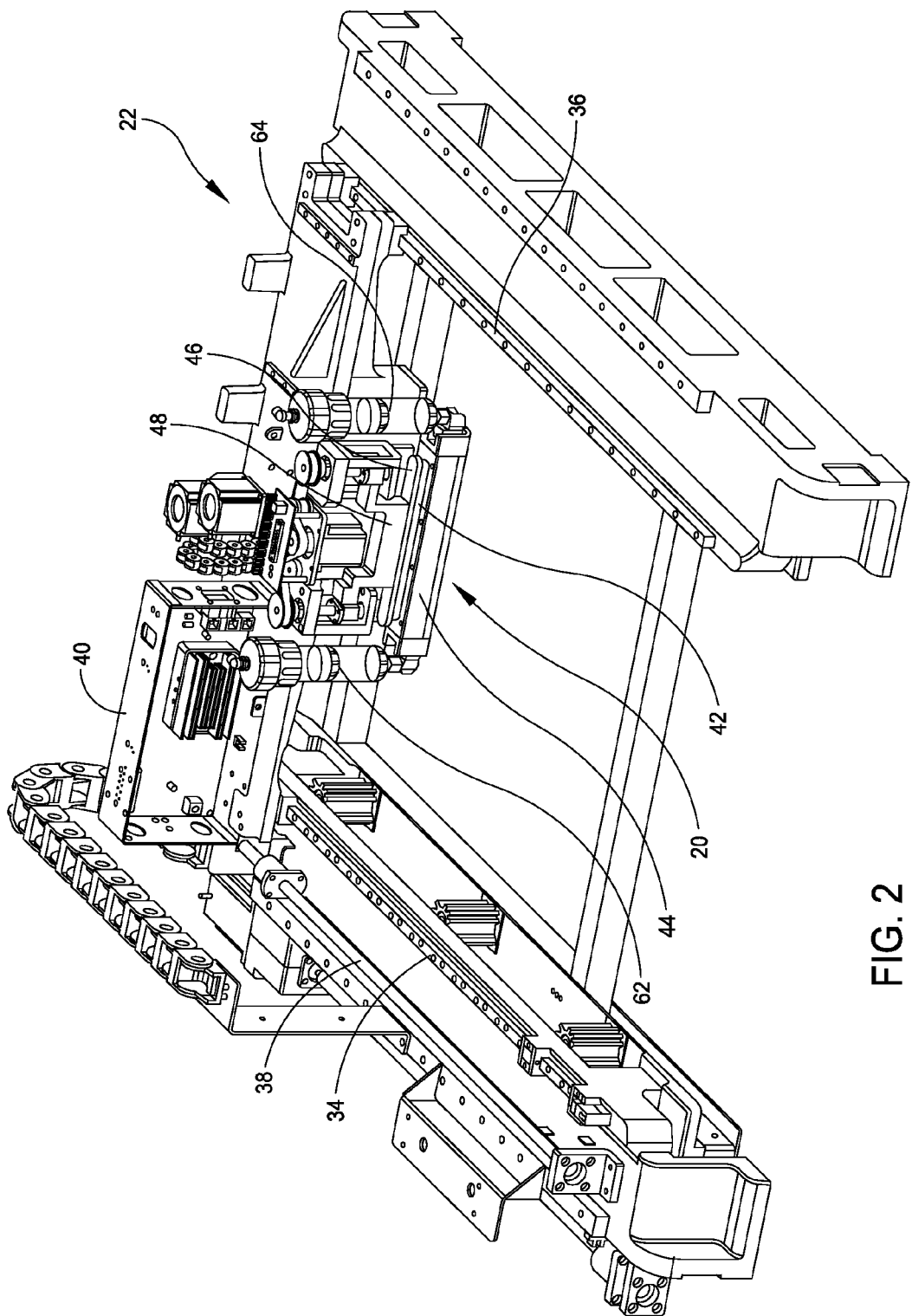
FIG. 2 is a perspective view of a print head supported by a print head gantry system.
Figure 3:
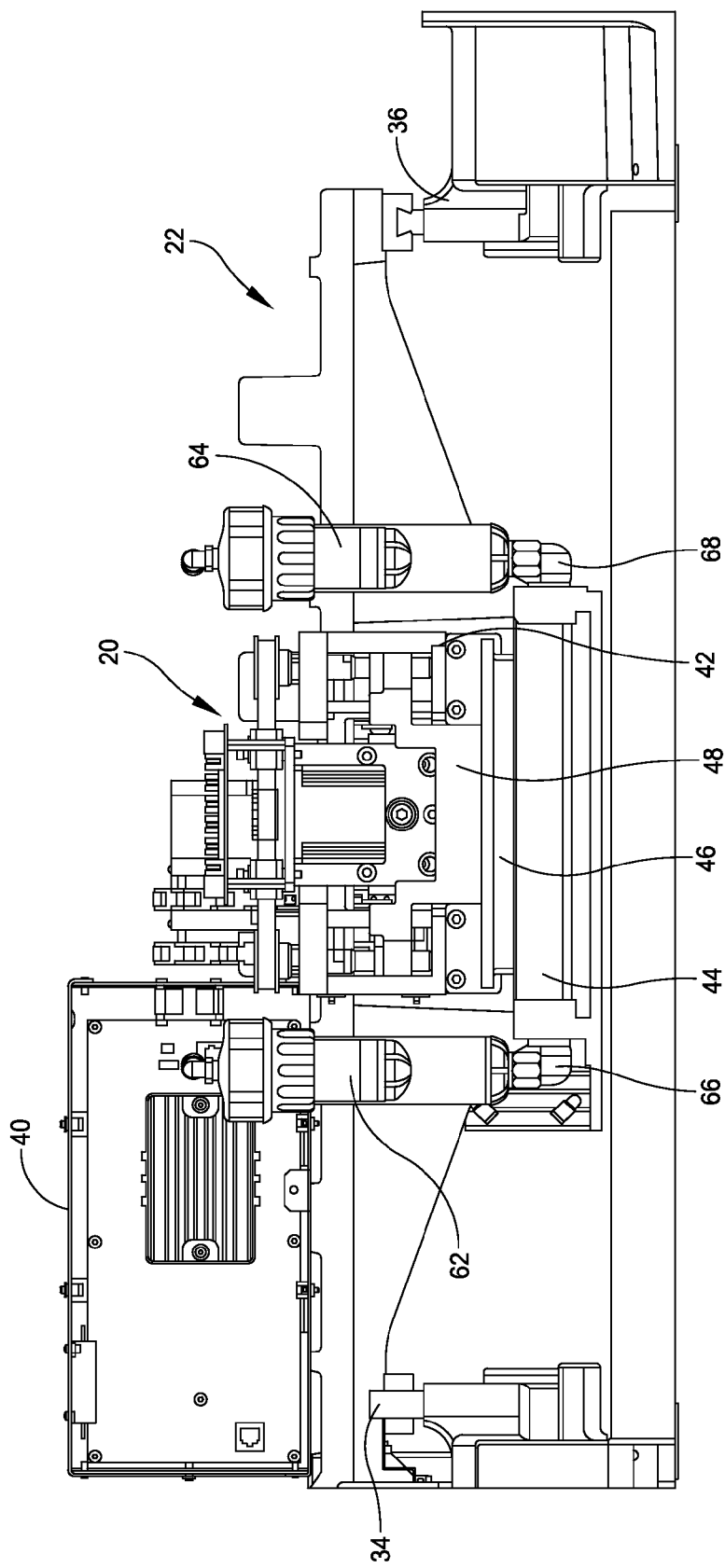
FIG. 3 is an end view of the print head and print head gantry system shown in FIG. 2.

Referring to FIGS. 2 and 3, the print head 20 and the print head gantry 22 are illustrated. As shown, the print head gantry 22 rides along a pair of rails 34, 36 to achieve movement of the print head gantry and the print head 20 in the y-axis direction. A ball screw 38 coupled to a drive motor (not shown) is provided to drive the movement of the print head gantry 22 along the rails in the y-axis direction. In another embodiment, a belt and pulley mechanism may be provided in place of the ball screw drive mechanism to achieve the movement of the print head gantry 22 along the rails. A drive assembly 40 is provided to move the print head 20 in a z-axis direction with respect to the print head gantry 22. The arrangement is such that the ball screw 38, upon command of the controller 14, moves the print head gantry 22 and the print head 20 to perform a print stroke. As will be described in greater detail below, the print head 20 is configured to move in the z-axis direction to engage the stencil 18 for depositing viscous material (e.g., solder paste) within the apertures of the stencil during the print stroke as the print head 20 moves in the y-axis direction.

The print head gantry 22 supports the working components of the print head 20. As shown, the print head 20 includes a support bracket 42 that is suitably secured to the print head gantry 22 so that the print head is centrally positioned on the print head gantry. The print head 20 further includes an elongate chamber housing 44, which is secured to the support bracket 42, a plunger 46, and a plunger actuator assembly 48 designed to move the plunger vertically with respect to the chamber housing.

Figure 4:
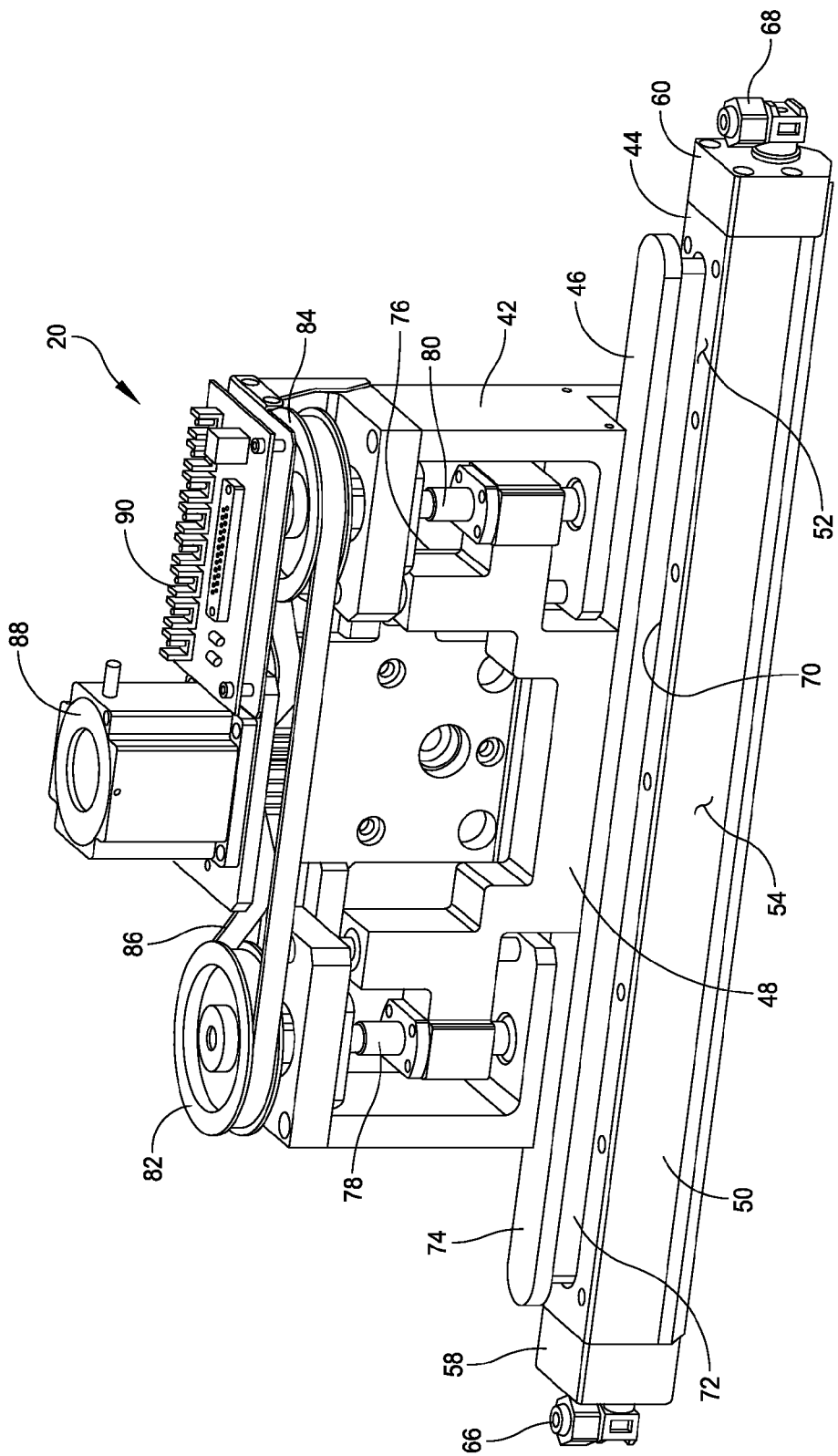
FIG. 4 is a perspective view of the print head taken from one end of the stencil printer.
Figure 5:
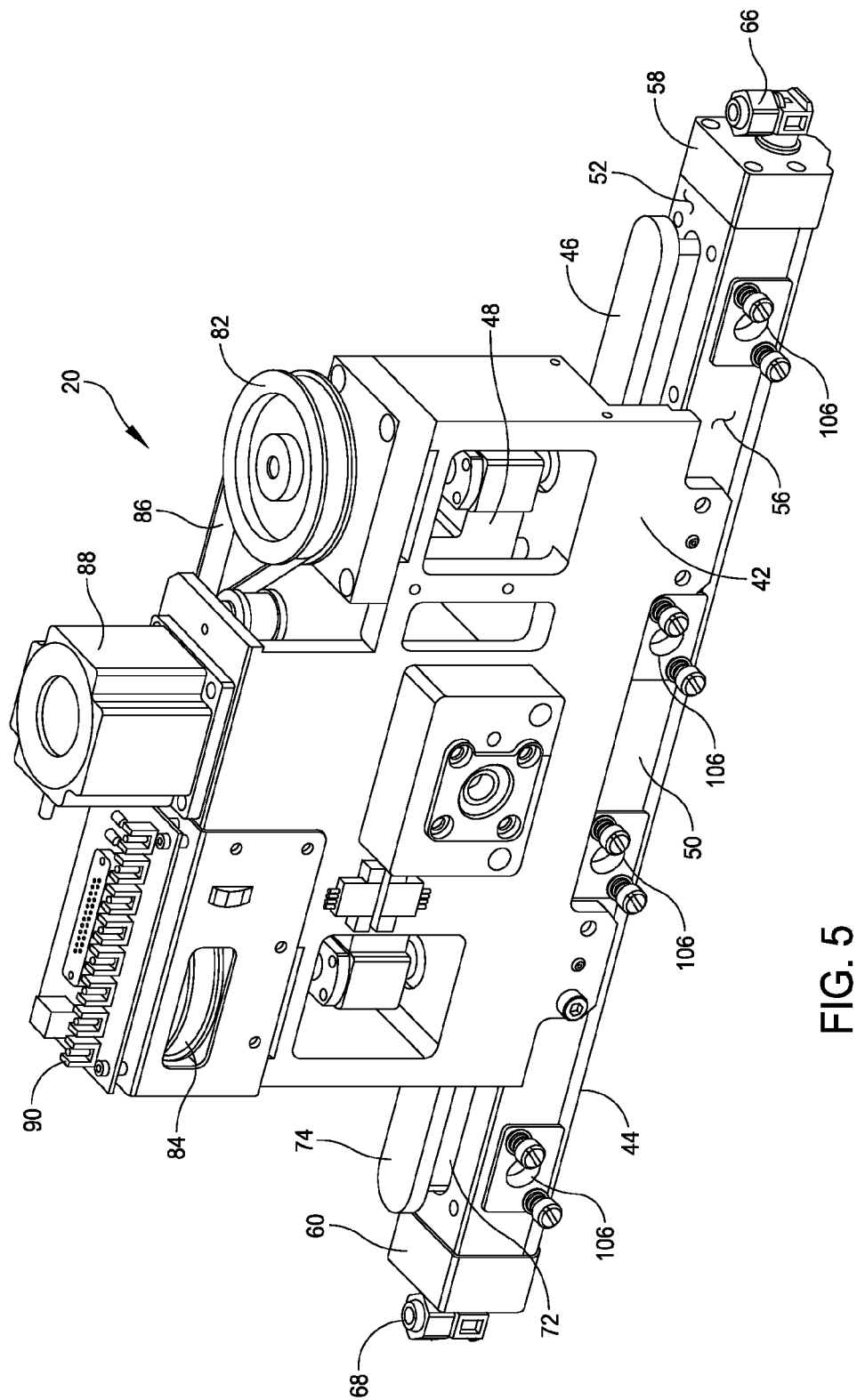
FIG. 5 is a perspective view of the print head shown in FIG. 4 taken from an opposite end of the stencil printer.

Referring to FIGS. 3-5, the chamber housing 44 includes a rectangular body 50 having a top wall 52 and two side walls 54, 56. The ends of the body 50 chamber housing 44 are enclosed by a pair of end caps 58, 60, which support respective material supply cartridges 62, 64. Specifically, the left-hand supply cartridge 62 as shown in FIG. 3 is connected to and supported by a fitting 66 that is secured to the end cap 58 to deliver viscous material to a left-hand side of the chamber housing 44. Similarly, the right-hand supply cartridge 64 is connected to and supported by a fitting 68 that is secured to the end cap 60 to deliver viscous material to a right-hand side of the chamber housing 44. The arrangement is such that viscous material is delivered to both ends of the chamber housing 44 to ensure that a suitable amount of viscous material is disposed in the chamber housing during a dispense operation. One or more additional supply cartridges may be suitably provided along the length of the chamber housing 44 to deliver viscous material to the interior regions of the chamber housing for longer print heads.

Referring now particularly to FIGS. 4 and 5, the elongate plunger 46 is designed to sealingly fit within an elongate chamber provided in the chamber housing 44 and accessible through an opening 70 formed in the top wall 52 of the chamber housing. As shown, the elongate plunger 46 includes a narrow body portion 72 that reciprocally moves within the elongate chamber, and a top flange portion 74, which is wider than the body portion. The plunger actuator assembly 48 includes a plunger actuator 76 that is secured to the top flange portion 74 of the elongate plunger 46, a pair of ball screws 78, 80 to enable z-axis movement of the plunger actuator with respect to the support bracket 42, a pair of pulleys 82, 84, which are driven by a belt 86 and a single stepper motor 88 mounted on the support bracket. The stepper motor 88 is shown mounted on a top surface of the support bracket 42; however, in another embodiment, the stepper motor may be mounted below the support bracket in a space defined by the plunger actuator 76 to save space. A circuit board 90, coupled to the controller 14, is provided to control the operation of the stepper motor 88 as well as the other components of the print head 20. The arrangement is such that upon operation of the stepper motor 88, the belt 86 and the pulleys 82, 84 rotate their respective ball screws 78, 80 to move the plunger actuator 76 in the z-axis direction. When operated, the body portion 72 of the elongate plunger 46 enters into the chamber of the chamber housing 44 to apply pressure on the viscous material.

Figure 7:
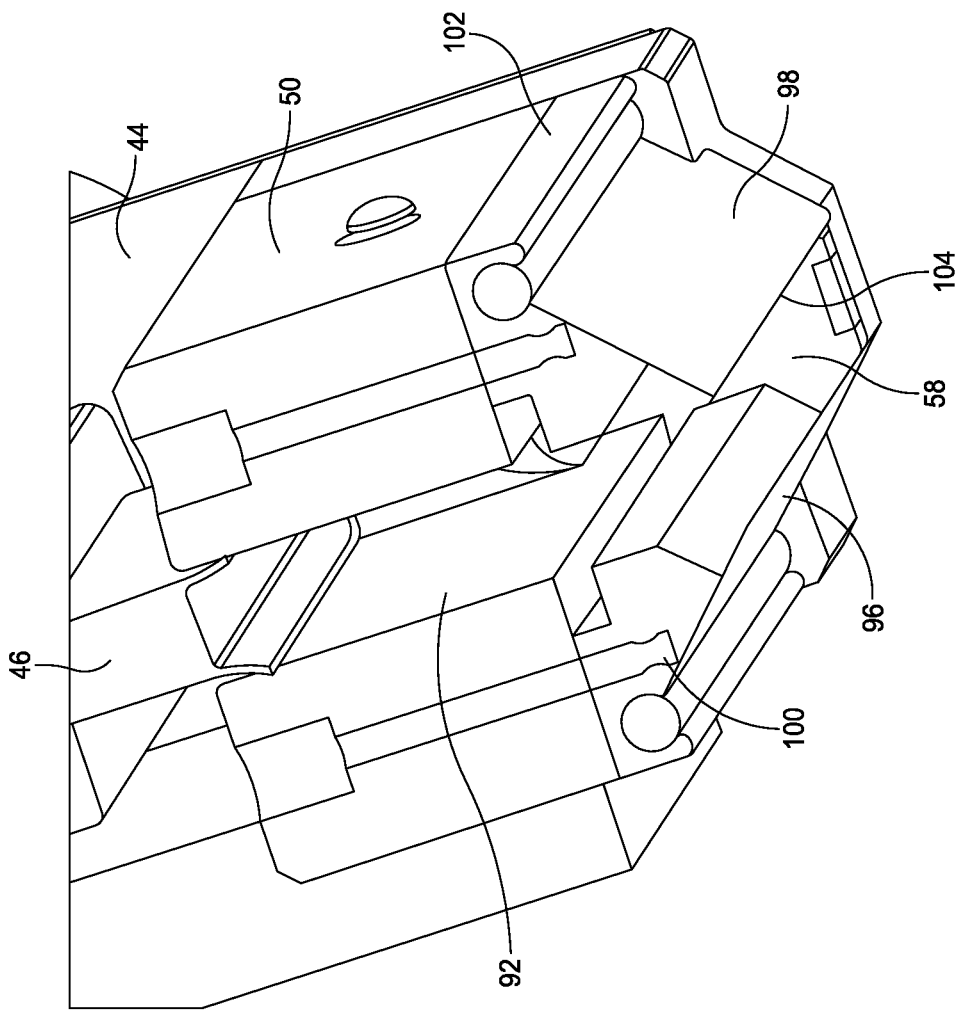
FIG. 7 is a perspective cross-sectional view of the print head.

Referring to FIGS. 6A and 6B, with additional reference to FIG. 7, the chamber housing 44 of the print head 20 further includes a chamber 92 formed in the body 50 of the chamber housing. As shown, the chamber 92 is accessible through the opening 70 and configured to receive viscous material from a port (e.g., port 94 shown in FIGS. 6A and 6B) in fluid communication with its respective supply cartridge 62 or 64. The viscous material in the chamber 92 is pressurized by the elongate plunger 46 when the plunger is moved downwardly in the z-axis direction by the plunger actuator assembly 48.

The print head 20 further includes a pair of blades 96, 98, which are pivotally attached to respective end caps (end cap 58 shown in FIGS. 6A and 6B) by pivot mechanisms 100, 102. As shown, each blade 96, 98 is angled in a direction toward one another to define a slot 104 through which viscous material is dispensed. During operation, the print head 20 is lowered to engage the stencil 18 by the drive assembly 40 so that the blades 96, 98 engage the stencil at a predetermined pressure. Once sufficiently engaged, the viscous material within the chamber 92, which is pressurized by the elongate plunger 46, enters the apertures formed in the stencil to deposit viscous material on the electronic substrate. FIG. 6A illustrates blades 96, 98 angled at 30° with respect to a horizontal plane. FIG. 6B illustrates blades 96, 98 angled 45° with respect to a horizontal plane. The angle of the blades 96, 98 may be selected based on the type of viscous material deposited on the electronic substrate as well as other operating parameters. The provision of end caps 58, 60 having pivot mechanisms 100, 102 connected to the blades 96, 98 enable the quick release and attachment of blades having different angles.

Referring back to FIG. 5, with additional reference to FIGS. 6A and 6B, to achieve a regulated pressure of viscous material within the chamber 92, the back side 56 of the elongate housing 44 is provided with several pressure transducers, each indicated at 106. Together, the pressure transducers 106 are configured to measure pressure within the chamber 92 of the chamber housing 44 by, for example, averaging the pressure within the chamber with the controller 14 and the circuit board 90. Although four pressure transducers 106 are shown in FIG. 5, any number of pressure transducers may be provided, e.g., three pressure transducers, to measure the pressure of viscous material within the chamber 92.

As shown in FIGS. 6A and 6B, when the plunger 46 is moved in the z-axis direction into the elongate chamber 92 by the plunger actuator 76 of the plunger actuator assembly 48, the viscous material within the chamber is pressurized. In certain embodiment, a desired or preset pressure is provided for optimal dispensing of material from the print head 20. Each pressure transducer 106 is coupled to the controller 14 and/or the circuit board 90 at 108, with the controller being configured to manipulate the plunger actuator to achieve the preset pressure. Specifically, the controller 14 is configured to respond to readings taken from the pressure transducers 106 to control the operation of the plunger 46 with the plunger actuator assembly 48 and the supply of viscous material provided to the chamber 92 by the supply cartridges 62, 64. This arrangement may be referred to as a "closed loop" system in that the supply of material and the pressurization of the material are automatically performed by the controller 14 (and/or the circuit board 90) to control this function of the print head 20.

Figure 8:
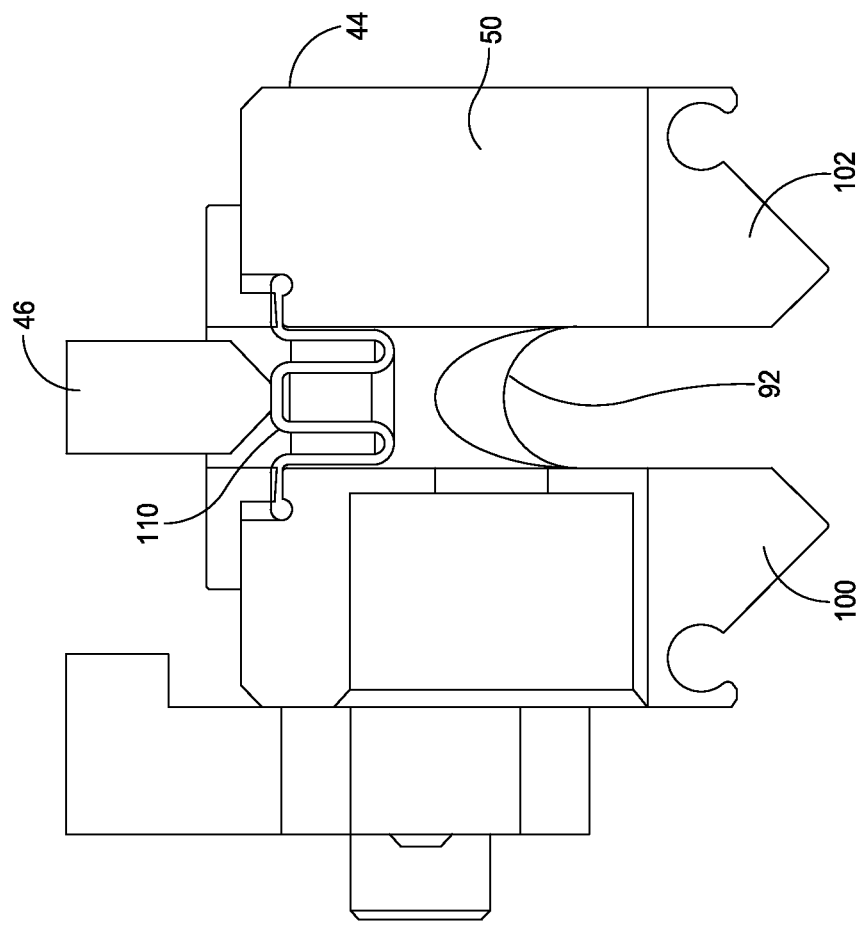
FIG. 8 is a cross-sectional view of a print head of another embodiment of the present disclosure.

Referring to FIG. 8, in one embodiment, a flexible membrane 110 is positioned between the elongate plunger 46 and the viscous material disposed within the elongate chamber 92. The flexible membrane 110 is provided to separate the elongate plunger 46 from the viscous material to better control the pressure of viscous material within the chamber 92.

In a certain embodiment, the stepper motor 88 that drives the movement of the elongate plunger 46 within the elongate chamber 92 may be programmed by the controller 14 (and/or the circuit board 90) to cause the vibration of the viscous material (e.g., solder paste) within the chamber. The vibration of the plunger 46 aides in the transfer of viscous material from the print head 20 to the stencil 18 when filling empty apertures provided in the stencil. In other embodiments, another device, such as a piezo electric device, may be used to vibrate the elongate plunger 46, especially at higher frequencies. Such a device may be independent of the stepper motor 88, the elongate plunger 46, and plunger actuator assembly 48.

During operation, several modes of operation of the print head 20 can be achieved. In a "ready to print" mode, an adequate fill of material is delivered to the elongate chamber 92 of the print head 20, and the blades 96, 98 touch the stencil 18 with zero housing force and zero material pressure.

In a "print" mode, the blades 96, 98 engage or are otherwise moved against the stencil 18 with the prescribed force with viscous material held in the elongate chamber 92 being forced by the elongate plunger 46 while the print head 20 is driven across the stencil and board at a prescribed distance and velocity by the print head gantry 22. While in "print" mode, the internal material pressure of the elongate chamber 92 is monitored and the elongate plunger 46 position is continually adjusted to maintain a prescribed pressure by the controller 14 (and/or the circuit board 90). Also, an oscillatory or vibrational motion can be applied to the plunger 46 to aid in transferring and packing the viscous material evenly into the apertures of the stencil 18. This motion would also be under the control of the controller 14 (and/or the circuit board 90).

In a "filling material" mode, the blades 96, 98 of the print head 20 are held against the supported stencil 18 or flat surface with a prescribed force. Initially, the elongate plunger 46 is at or below the lower end of the print operational end of travel or touching the top of the existing fill of material. As viscous material is fed into the elongate chamber 92 through the port 94 by the respective supply cartridges 62, 64, internal material pressure is monitored and the elongate plunger 46 is raised so as to maintain a prescribed fill pressure. Thus, the movement of the elongate plunger 46 is coordinated with the filling material by the controller 14 (and/or the circuit board 90). The filling continues until the elongate plunger 46 reaches the top of the print operational range of travel. While material filling is in progress, an oscillatory motion as described above can be applied to the plunger 46 to aid in distributing the material evenly throughout the housing chamber 92.

In a "cleaning" mode, the elongate plunger 46 can be raised out of the chamber 92 of the elongate housing 44 to aid in cleaning the plunger and the housing.

In a "raised" mode, the elongate housing 44 can be raised off of the stencil 18 to aid in cleaning or to change stencils. The "raised" mode can utilize a z-axis motion routine to relieve the adhesion between the print head 20 and the stencil 18.

In one embodiment, the print head includes source ports at each end configured to receive standard three-ounce or six-ounce solder paste cartridges that provide solder paste to the print head during a printing operation. Each of the cartridges is coupled to one end of a pneumatic air hose with the other end of the air hose being coupled with an air compressor that forces solder paste from the cartridge into the print head. As is readily understood by those skilled in the art, the print head can be adapted to receive other standard, or non-standard, cartridges or other sources of solder paste. A mechanical device, such as a piston, may be used in addition to, or in place of, air pressure to force the solder paste from the cartridges into the print head.

Any number of source ports can be provided on the print head to couple more or fewer cartridges with the print head. The number of cartridges is selected based on the length of the print head and the capacity of the cartridge used. The length of the print head is determined, in part, based on the width of the electronic substrates (e.g., circuit boards) to be printed upon. If the size of the circuit board changes, the print head may be replaced by a new print head having a length sized for the new circuit board. The effective length of the dispensing slot (where the length is measured along an axis perpendicular to the plane of the illustrated section) may also be reduced to accommodate smaller circuit boards by partially covering a portion of the slot. In a certain embodiment, the dispensing slot is about 20 cm to about 60 cm (8-24 inches) in length.

As discussed, the print head includes a housing that defines an elongate chamber. In one embodiment, the chamber is segregated by a flexible membrane (FIG. 8) into an activation region and a dispensing region. In particular embodiments, the dispensing region has a length of 20-60 cm and a diameter/width of about 1 cm. The membrane can be formed from a flexible polymer, such as latex or silicone.

As further discussed, when the print head is in the lowered printing position so that it is in contact with the stencil, the stencil printer operates by feeding solder paste from the cartridge into the dispensing region. With the dispensing region filled with solder paste, the compressed gas source pumps gas into the activation region, thereby exerting pressure against the flexible membrane. The flexible membrane is displaced toward the slot as a result of this pressure, and solder paste is thereby driven from the dispensing region through the slot and out of the chamber. The dispensed solder paste then flows onto a stencil positioned over a substrate, such as a printed circuit board, the solder flowing through apertures in the stencil onto the printed circuit board in a pre-defined pattern.

Between the two blades, the solder paste is pressurized. To prevent the pressurized solder paste from breaking the seal formed at the interface of the blades and the stencil, force is applied to the print head to press it against the stencil. The force can be applied via a pneumatic actuator. At the end of a stroke across the stencil by the print head, the blade that was previously the trailing blade becomes the leading blade as the print head is passed back across the stencil in the opposite direction.

In a certain embodiment, a print head coupled with a controller having a computer-readable storage medium coupled with a processor for executing software code stored on the storage medium.

Use of the displacement mechanism (with or without the flexible membrane) allows for a print head design where the displacement region of the chamber can have a very small cross-section in planes perpendicular to the long axis of the chamber, yet the solder paste can still be dispensed substantially evenly through the slot along its length. Use of a comparatively small dispensing region and the even flow of solder paste out of the chamber help to reduce or delay the onset of solder-paste compaction. Moreover, the displacement mechanism enables highly responsive governance over the flow of solder paste through the slot.

In other embodiments, viscous materials other than solder paste are printed using the apparatus and methods described above. In one embodiment, liquid epoxy is printed from the print head. Liquid epoxy can be used as an underfill for chip-scale packages, where the epoxy is deposited onto an area about 1 $cm^2$ on a printed circuit board, and the chip is then mounted onto the epoxy.

Thus, it should be observed that the print head of embodiments of the present disclosure is capable of precisely controlling pressure within a chamber of the print head during a print operation. The precise pressure control achieved by the print head improves the quality of the print operation. Specifically, the print head is capable of maintaining a consistent pressure of viscous material within the chamber to improve the integrity of the print deposit across a width of the entire electronic substrate.

Embodiments are not limited in their application to the details of construction and the arrangement of components set forth in the following description or illustrated in the drawings. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. A stencil printer for printing viscous material on an electronic substrate, the stencil printer comprising:
   a stencil having apertures formed therein;
   a print head positioned over the stencil and configured to deposit viscous material within the apertures of the stencil, the print head includes two or more sensors to detect pressure of the viscous material within the print head; and
   a controller coupled with the print head to control the operation of the print head to maintain a consistent pressure of viscous material within the print head along a length of the print head to improve the integrity of a print deposit across a width of the entire electronic substrate, the controller being configured to receive readings from the two or more sensors and to average readings taken from the two or more sensors within the print head to control pressure of viscous material.

2. The stencil printer of claim 1, wherein the print head includes a housing defining an elongate chamber, and a pair of blades defining a slot that provides an outlet from which viscous material can flow out of the elongate chamber.

3. The stencil printer of claim 2, wherein the print head further includes an elongate plunger movable in the elongate chamber to pressurize viscous material within the elongate chamber.

4. The stencil printer of claim 3, further comprising a flexible membrane positioned between the elongate plunger and the viscous material disposed within the elongate chamber.

5. The stencil printer of claim 3, wherein the two or more sensors of the print head are located along a length of the elongate chamber to detect pressure of the viscous material within the elongate chamber.

6. The stencil printer of claim 5, wherein the two or more sensors each includes a pressure transducer provided along a wall of the elongate chamber.

7. The stencil printer of claim 3, wherein the print head further includes a plunger actuator configured to drive the movement of the elongate plunger within the elongate chamber.

8. The stencil printer of claim 7, wherein the plunger actuator includes at least one ball screw coupled to the elongate plunger and a stepper motor coupled to the housing and the at least one ball screw to drive the movement of the elongate plunger within the elongate chamber.

9. The stencil printer of claim 8, wherein the stepper motor is manipulated by the controller to cause a vibration of viscous material within the elongate chamber.

10. A method for printing solder paste comprising:
supplying viscous material to an elongate chamber of a print head with two supply cartridges in fluid communication with the elongate chamber;
applying pressure to the viscous material with an elongate plunger to displace the viscous material onto a substrate;
sensing pressure within the elongate chamber to maintain the viscous material at a consistent pressure with two or more pressure transducers positioned within the elongate chamber along a length of the elongate chamber; and
positively controlling the amount of viscous material discharged from the elongate chamber during a print stroke by controlling the amount of viscous material delivered to the elongate chamber and actuating a plunger actuator coupled to the elongate plunger to move the elongate plunger and to maintain a consistent pressure of viscous material within the print head along a length of the print head to improve the integrity of a print deposit across a width of the an entire electronic substrate,
wherein sensing pressure within the elongate chamber includes averaging readings taken from the two or more pressure transducers positioned within the elongate chamber to control pressure of viscous material within the elongate chamber.

11. The method of claim 10, wherein the plunger actuator includes at least one ball screw coupled to the elongate plunger and a stepper motor coupled to the housing and the at least one ball screw to drive the movement of the elongate plunger within the elongate chamber under the control of a controller.

12. The method of claim 10, further comprising disposing a flexible membrane between the elongate plunger and viscous material disposed within the elongate chamber.

13. The method of claim 10, wherein sensing pressure occurs at a left-hand side of the elongate chamber and at a right-hand side of the elongate chamber.

14. The method of claim 10, wherein the viscous material is solder paste, and wherein the method further comprises passing the solder paste through a stencil as the solder paste is discharged from the elongate chamber for selective deposition on the substrate.

15. The method of claim 10, further comprising configuring the print head to operate in several modes of operation, including a ready to print mode in which a fill of material is delivered to the elongate chamber of the print head.

16. The method of claim 10, further comprising configuring the print head to operate in several modes of operation, including a print mode in which blades of the print head engage a stencil with a prescribed force with viscous material held in the elongate chamber being forced by the elongate plunger while the print head is driven across the stencil and board at a prescribed distance and velocity by a print head gantry.

17. The method of claim 16, wherein a vibrational motion is applied to the elongate plunger to aid in transferring and packing the viscous material evenly into the apertures of the stencil.

18. The method of claim 10, further comprising configuring the print head to operate in several modes of operation, including a filling material mode in which blades of the print head are held against a stencil with a prescribed force, an internal material pressure of the elongate chamber is monitored, and the elongate plunger is raised so as to maintain a prescribed fill pressure.

19. The method of claim 18, wherein a vibrational motion is applied to the elongate plunger to aid in distributing the material evenly throughout the elongate chamber.

* * * * *